United States Patent [19]

Kim

[11] Patent Number: 5,527,727

[45] Date of Patent: Jun. 18, 1996

[54] METHOD OF MANUFACTURING SPLIT GATE EEPROM CELLS

[75] Inventor: Myong S. Kim, Seoul, Rep. of Korea

[73] Assignee: Hyundai Electronics Industries Co. Ltd., Kyungki-do, Rep. of Korea

[21] Appl. No.: 534,170

[22] Filed: Sep. 26, 1995

[30] Foreign Application Priority Data

Sep. 27, 1994 [KR] Rep. of Korea ...................... 94-24257

[51] Int. Cl.$^6$ ............................................... H01L 21/8247
[52] U.S. Cl. ................................. 437/43; 437/26; 437/984
[58] Field of Search .................................... 437/26, 43, 44, 437/49, 984

[56] References Cited

U.S. PATENT DOCUMENTS

| | | | |
|---|---|---|---|
| 4,795,719 | 1/1989 | Eitan | 437/984 |
| 4,852,062 | 7/1989 | Baker et al. | 437/43 |
| 4,924,437 | 3/1990 | Paterson et al. | 437/43 |
| 5,162,247 | 11/1992 | Hazani | 437/43 |
| 5,395,779 | 3/1995 | Hong | 437/43 |

*Primary Examiner*—Chandra Chaudhari
*Attorney, Agent, or Firm*—Fish & Richardson

[57] ABSTRACT

The present invention discloses a method of manufacturing flash EEPROM cells. An active region is defined to include a source bit line region and a drain bit line region. When a first polysilicon layer is etched through a floating gate mask work and an etching process, a silicon substrate in the source bit line region and the drain bit line region become exposed. A buried N$^+$ layer is formed in the exposed silicon substrate by implanting impurity ions. A thick oxide film is formed on the buried N$^+$ layer by a subsequent oxidation process, and this thick oxide film is etched to a constant thickness by a self-aligned etching process for forming a float gate. Thereafter, a select gate oxide film and a select gate are formed by a general process. The present invention can thus improve the electrical characteristics of a cell by decreasing the topology generated by the oxide film formed in a bit line containing a source region and a drain region, and can simplify the process by forming a bit line containing a source region and a drain region by performing the buried N$^+$ impurity ion implantation process only once.

1 Claim, 3 Drawing Sheets

(PRIOR ART) FIG. 1
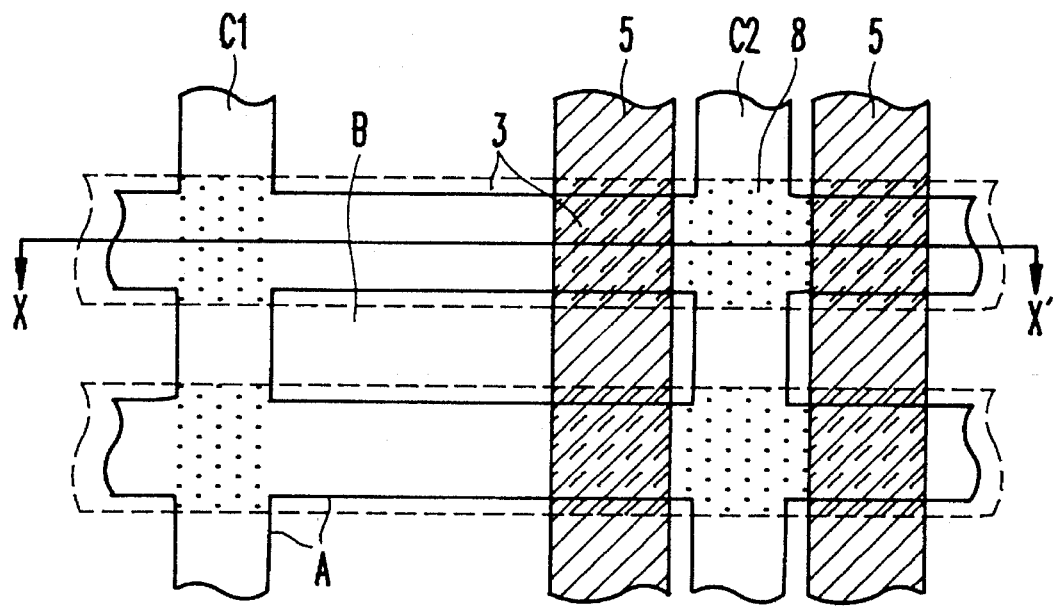
(PRIOR ART) FIG. 2
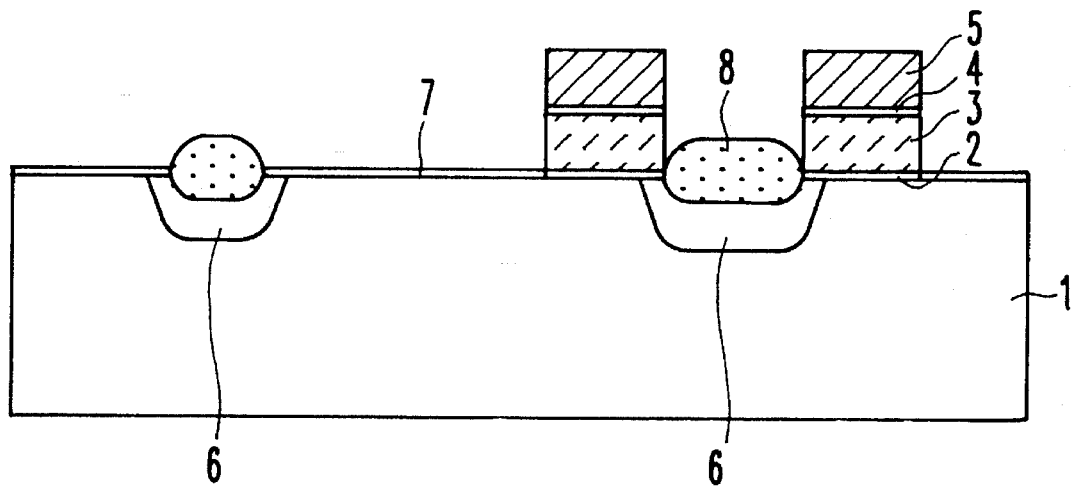

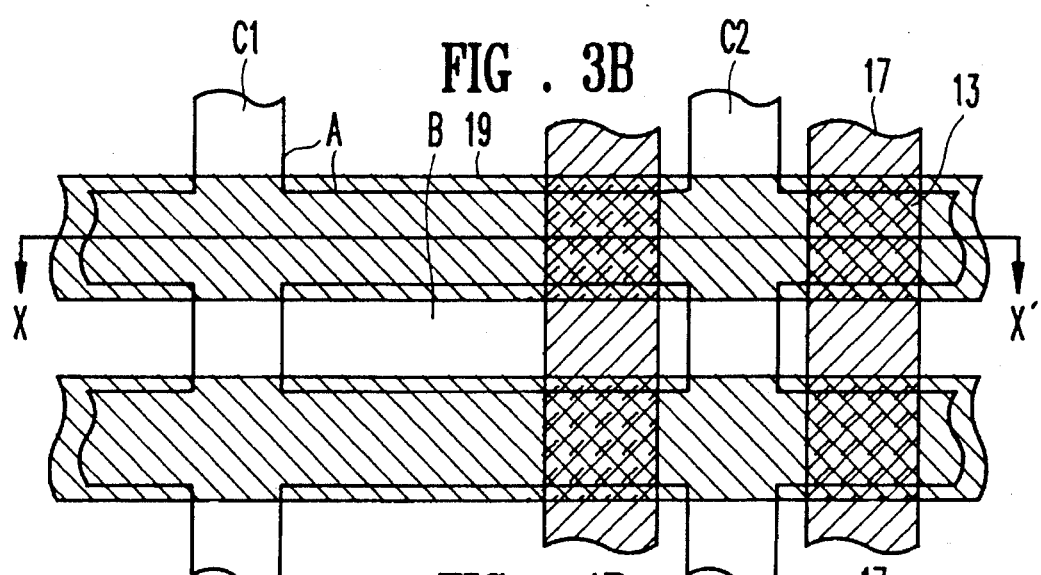
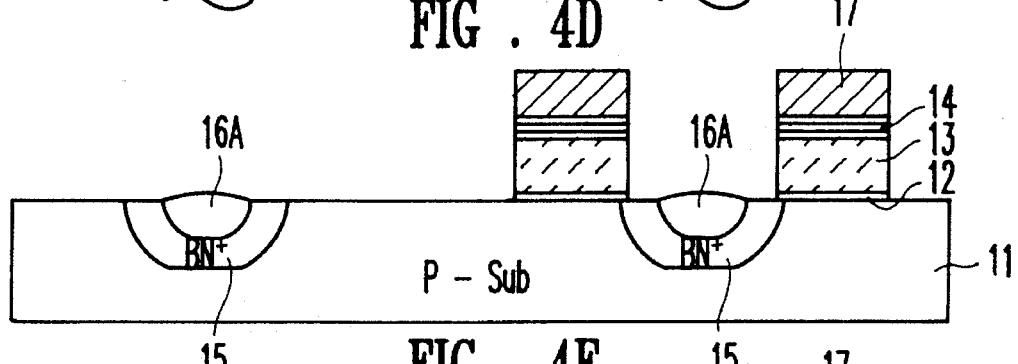
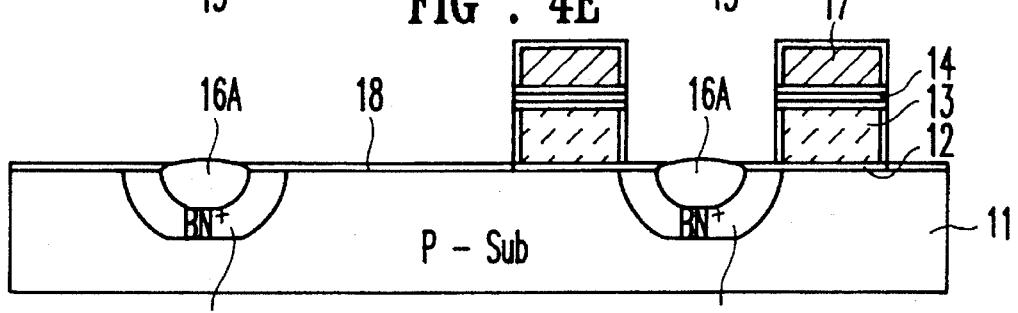
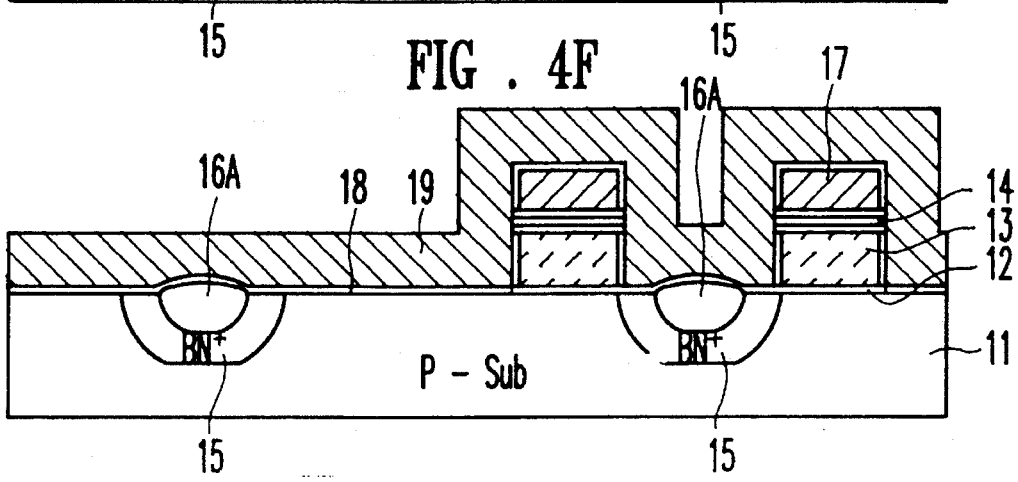

5,527,727

METHOD OF MANUFACTURING SPLIT GATE EEPROM CELLS

BACKGROUND OF INVENTION

1. Field of the Invention

The present invention relates to a method of manufacturing a flash electrically erasable programmable read-only memory (EEPROM), and particularly to a method of manufacturing a flash EEPROM which can reduce the topology produced by an oxide film formed in a buried bit line in which a source region and a drain region are contained.

2. Information Disclosure Statement

FIG. 1 is a layout showing general split gate type flash EEPROM cells and FIG. 2 is a sectional view of the cells taken along line X—X' of FIG. 1.

Referring to FIGS. 1 and 2, an active region A and a field region B are defined by an isolation technology. The active region A is defined to include bit line regions C1 and C2 and a channel region. A field oxide film (not shown) is formed on a silicon substrate 1 of the field region B by an oxidation process. Floating gates 3 are formed along both sides of the bit line region C2 and for each cell region. Control gates 5 are longitudinally formed along both sides of the bit line region C2. A tunnel oxide film 2 is formed between the floating gate 3 and the silicon substrate 1. An interlayer dielectric film 4 is formed between the floating gate 3 and the control gate 5. Impurity diffusion layers 6 are formed in the source bit line region C1 and the drain bit line region C2 by means of a source/drain impurity ion implantation process. A select gate oxide film 7 is formed at an exposed portion of the silicon substrate 1 by an oxidation process, during which a thick oxide film 8 is formed on the impurity diffusion layers 6 as a result of the high rate of oxidation on the layers 6. As the oxide film 8 formed on the impurity diffusion layer 6 becomes thicker, the topology becomes higher. Due to such high topology, a subsequent process such as the formation of the select gate (not shown) becomes more difficult, thereby causing a problem of the electrical characteristics of the cell being degraded.

Therefore, the object of the present invention is to provide a method of manufacturing flash EEPROM cells which can improve the electrical characteristics of the cell by decreasing the topology produced by the oxide film formed in a bit line in which a source region and a drain region are contained.

SUMMARY OF THE INVENTION

To accomplish the above object a method of manufacturing flash EEPROM cells according to the present invention, comprising the steps of:

providing a silicon substrate on which a field oxide film is formed; sequentially forming a tunnel oxide film, a first polysilicon layer, a lower oxide film and a nitride film on the silicon substrate containing the field oxide film; sequentially etching the nitride film, lower oxide film, first polysilicon layer and tunnel oxide film to expose the field oxide film and the silicon substrate in a source bit line region and a drain bit line region through a floating game mask operation and an etching process; forming a buried $N^+$ layer in the exposed silicon substrate of the source bit line region and drain bit line region by an N-type impurity ion implantation process; forming an interlayer dielectric film of an ONO structure by forming an upper oxide film on the nitride film by an oxidation process and, at the same time, forming a thick oxide film on the buried $N^+$ layer; forming a second polysilicon layer on the entire structure including the interlayer dielectric film and thick oxide film; etching the second polysilicon layer through a control gate mask work and an etching process, thereby forming control gates along both sides of the drain bit line region; etching the first polysilicon layer by a self-aligned etching method by continuously performing the control gate mask work and the etching process, thereby forming floating gates along both sides of the drain bit line region, one for each cell region and, at this time, etching to a constant thickness the thick oxide film formed on the buried $N^+$ layer; forming a select gate oxide film by an oxide process; forming a third polysilicon layer on the entire structure containing the select gate oxide film; and etching the third polysilicon layer through a select gate mask work and an etching process, thereby forming select gates.

BRIEF DESCRIPTION OF THE DRAWINGS

For fuller understanding of the nature and objects of the invention, reference should be had to the following detailed description taken in conjunction with the accompanying drawings in which:

FIG. 1 is a layout showing general flash EEPROM cells;

FIG. 2 is a sectional view of the device taken along line X—X' of FIG. 1;

FIGS. 3A and 3B are layouts showing flash EEPROM cells of the present invention; and FIGS. 4A through 4F are sectional views of the device to illustrate the steps of manufacturing flash EEPROM cells of the present invention.

Similar reference characters refer to similar parts through the several views of the drawings.

DETAILED DESCRIPTION OF THE INVENTION

FIG. 1 is a layout showing general flash EEPROM cells and FIG. 2 is a sectional view of the device taken along line X—X' of FIG. 1.

Figure 3A:
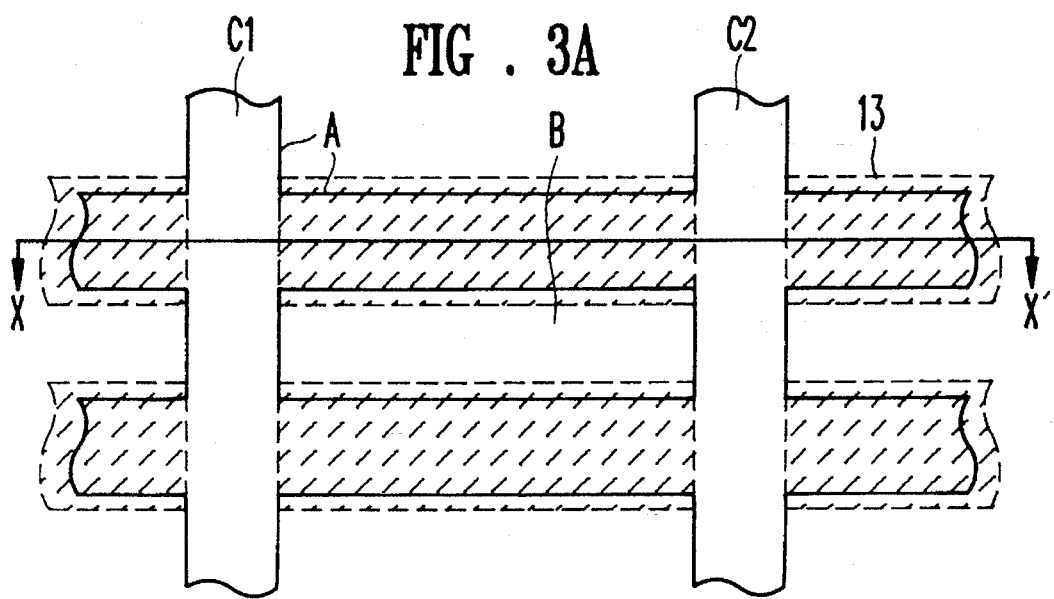
Figure 4A:
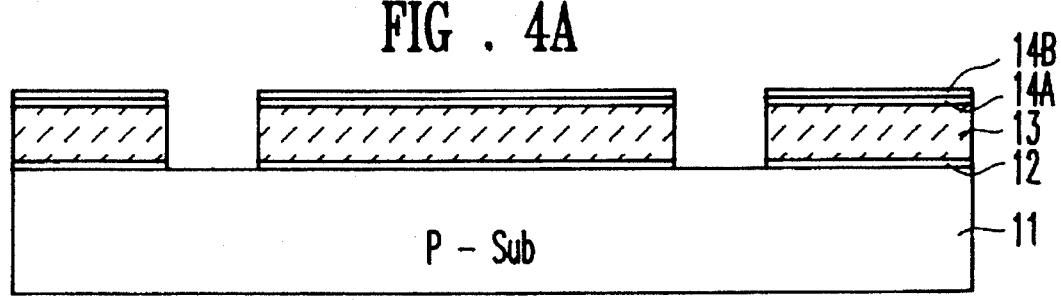
Figure 4B:
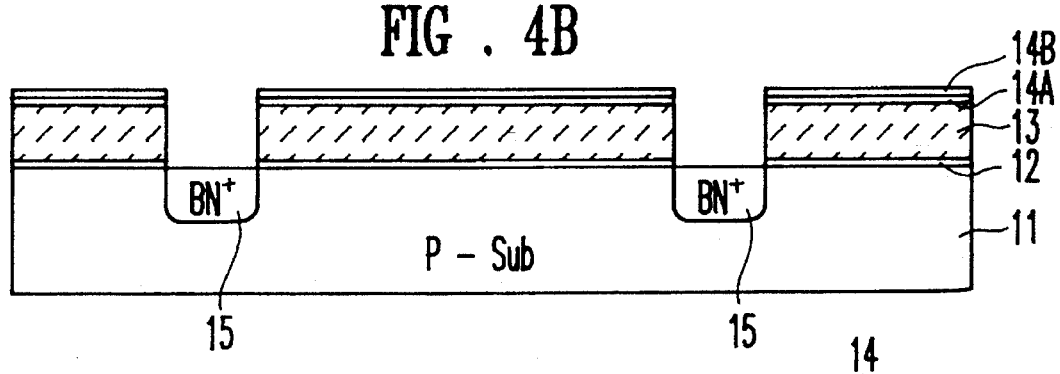
Figure 4C:
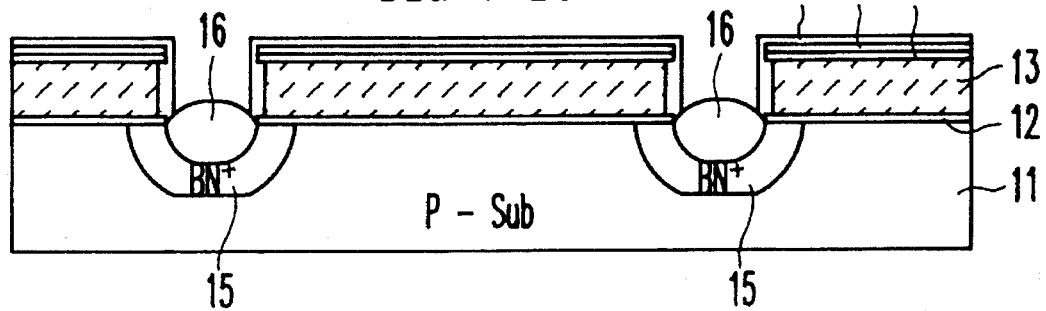

FIGS. 3A and 3B are layouts showing flash EEPROM cells of the present invention and FIGS. 4A through 4F are sectional views of the device to illustrate the steps of manufacturing flash EEPROM cells of the present invention. FIGS. 4A through 4C are sectional views of the device taken along line X—X' of FIG. 3A, and FIGS. 4D through 4F are sectional views of the device taken along line X—X' of FIG. 3B.

Referring to FIGS. 3A and 4A, an active region A and a field region B are defined. The active region A is defined to include bit line regions C1 and C2 and a channel region. A field oxide film (not shown) is formed on a P-type silicon substrate 11 of the field region B by an oxidation process. A tunnel oxide film 12 is formed on an exposed portion of the P-type silicon substrate 11. A first polysilicon layer 13, a lower oxide film 14A and a nitride film 14B are sequentially formed on the entire structure including the tunnel oxide film 12 and the field oxide film. The nitride film 14B, lower oxide film 14A, first polysilicon layer 13 and tunnel oxide film 12 are sequentially etched to expose the p-type silicon substrate 11 in the bit line region C1 and C2 and the field oxide film in the field region B through a floating gate mask work and an etching process.

FIGS. 3A and 4B show a condition in which the buried $N^+$ layers 15 are formed in the exposed p-type silicon substrate 11 in the source bit line region C1 and drain bit line region C2 by an N-type impurity ion implantation process.

Referring to FIGS. 3A and 4C, an upper oxide film 14C is formed on the nitride film 14B by an oxide process, whereby an interlayer dielectric film 14 of an ONO(Oxide-Nitride-Oxide) structure is completed on the first polysilicon layer 13. During the oxidation process for forming the upper oxide film 14, a thick oxide film 16 is formed on the buried $N^+$ layer 15 as a result of a high rate of oxidation. For example, in forming an outer oxide film 14C to a thickness of 300Å, an oxide film 16 is formed to a topology of a thickness of approximately 2000Å.

Referring to FIGS. 3B and 4D, a second polysilicon layer 17 is formed on the entire structure including the interlayer dielectric film 14 and the oxide film 16. The second polysilicon layer 17 is etched through a control gate mask work and an etching process, whereby control gates 17 are formed along both sides of the drain bit line region C2. The first polysilicon layer 13 is etched by a self-aligned etching method by continuously performing control gate mask work and an etching process, whereby floating gates 13 are formed along both sides of the drain bit line region C2, one for each cell region. A thick oxide film 16 formed on the buried $N^+$ layer 15 is etched to a constant depth during the self-aligned etching process for forming floating gates 13. As a result, the surface of the etched oxide film 16A becomes almost flush with the surface of the substrate 11.

FIG. 4E shows a condition in which a select gate oxide film 18 is formed by an oxidation process. No additional oxide film is formed on the oxide film 16A that is formed on the buried $N^+$ layer 15 because of the low rate of oxidation during the oxidation process for forming the select gate oxide film 18.

Referring to FIG. 4F, a third polysilicon layer 19 is formed on the entire structure including the select gate oxide film 18. The third polysilicon layer 19 is etched through a select gate mask work and an etching process, thereby forming a select gate 19. This process can easily be carried out at the time of forming the third polysilicon layer 19 since no difference in topology is generated by the oxide film 16A that is formed on the buried $N^+$ layer 15.

As described above, the present invention can improve the electrical characteristics of a cell by decreasing the topology generated by the oxide film formed in the bit line containing a source region and a drain region, and can simplify such process by forming a bit line containing a source region and a drain region by performing the buried $N^+$ impurity ion implantation process only once.

Although this invention has been described in its preferred embodiment with a certain degree of particularity, one skilled in the art should know that the preferred embodiment disclosed herein serves only as an example and that the construction, combination and arrangement of its parts may be varied without departing from the spirit and the scope of the invention.

What is claimed is:

1. A method of manufacturing flash EEPROM cells comprising the steps of:

providing a silicon substrate on which a field oxide film is formed;

sequentially forming a tunnel oxide film, a first polysilicon layer, a lower oxide film and a nitride film on said silicon substrate containing said field oxide film;

sequentially etching said nitride film, lower oxide film, first polysilicon layer and tunnel oxide film to expose said field oxide film and said silicon substrate in a source bit line region and a drain bit line region through a floating gate mask operation and an etching process;

forming a buried $N^+$ layer in said exposed silicon substrate of said source bit line region and drain bit line region by an N-type impurity ion implantation process;

forming an interlayer dielectric film of an ONO structure by forming an upper oxide film on said nitride film by an oxidation process and, at the same time, forming a thick oxide film on said buried $N^+$ layer;

forming a second polysilicon layer on the entire structure including said interlayer dielectric film and thick oxide film;

etching said second polysilicon layer through a control gate mask work and an etching process, thereby forming control gates along both sides of said drain bit line region;

etching said first polysilicon layer by a self-aligned etching method by continuously performing said control gate mask work and said etching process, thereby forming floating gates along both sides of said drain bit line region, one for each cell region and, at this time, etching to a constant thickness said thick oxide film formed on said buried $N^+$ layer;

forming a select gate oxide film by an oxide process;

forming a third polysilicon layer on the entire structure containing said select gate oxide film; and etching said third polysilicon layer through a select gate mask work and an etching process, thereby forming select gates.

* * * * *